(12) United States Patent
Konishi

(10) Patent No.: US 7,655,107 B2
(45) Date of Patent: Feb. 2, 2010

(54) METHOD FOR ESTABLISHING ANISOTROPIC CONDUCTIVE CONNECTION AND ANISOTROPIC CONDUCTIVE ADHESIVE FILM

(75) Inventor: Misao Konishi, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 252 days.

(21) Appl. No.: 10/557,883

(22) PCT Filed: Sep. 30, 2004

(86) PCT No.: PCT/JP2004/014330

§ 371 (c)(1),
(2), (4) Date: Nov. 22, 2005

(87) PCT Pub. No.: WO2005/083772

PCT Pub. Date: Sep. 9, 2005

(65) Prior Publication Data

US 2007/0068622 A1    Mar. 29, 2007

(30) Foreign Application Priority Data

Feb. 26, 2004    (JP) ............................ 2004-052260

(51) Int. Cl.
*B32B 38/04* (2006.01)
(52) U.S. Cl. ............... 156/275.7; 156/272.2; 156/273.5
(58) Field of Classification Search ............. 156/272.2, 156/273.3, 273.5, 275.5, 307.1, 307.7; 252/500, 252/501.1, 512; 427/487
See application file for complete search history.

(56) References Cited

U.S. PATENT DOCUMENTS

| 5,187,020 | A  | * | 2/1993 | Kwon et al. ................ 428/601 |
| 5,296,063 | A  | * | 3/1994 | Yamamura et al. ........... 156/64 |
| 6,189,208 | B1 | * | 2/2001 | Estes et al. .................... 29/840 |
| 6,584,684 | B2 | * | 7/2003 | Brofman et al. ............... 29/840 |

FOREIGN PATENT DOCUMENTS

| JP | 2000105388 A | * | 4/2000 |
| JP | A-2000-104033 |   | 4/2000 |
| JP | A-2002-057191 |   | 2/2002 |

OTHER PUBLICATIONS

Machine Translation of JP 2000105388 A.*
Translation of JP2000-105388A, Takehashi, Feb. 2009.*

* cited by examiner

*Primary Examiner*—John L Goff
*Assistant Examiner*—Daniel McNally
(74) *Attorney, Agent, or Firm*—Oliff & Berridge, PLC

(57) ABSTRACT

An anisotropic conductive adhesive film and method for anisotropically and conductively connecting a connection terminal of a circuit board to a connection portion of an electronic device ensuring the fluidity of an anisotropic conductive adhesive film during electrical connection of the connection terminals of circuit boards to the connection portions of electronic devices using the anisotropic conductive adhesive film, in such a manner that the conductive particles are effectively confined, that the pressure required for compression bonding is not increased, and that the temporary bonding of the circuit boards to the electronic devices is effected at sufficient strength.

1 Claim, 4 Drawing Sheets

FIG.4
(a) 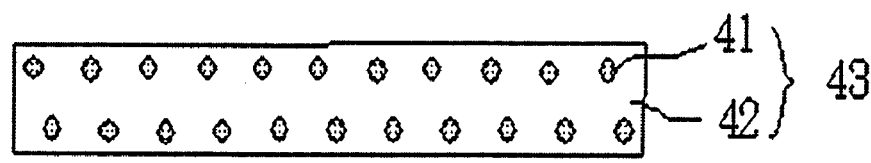
(b) 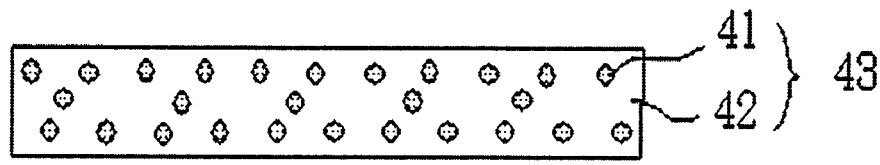
(c) 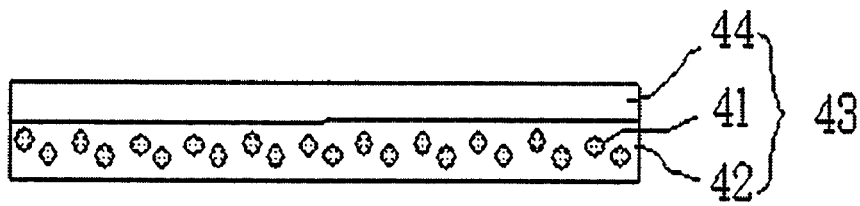

METHOD FOR ESTABLISHING ANISOTROPIC CONDUCTIVE CONNECTION AND ANISOTROPIC CONDUCTIVE ADHESIVE FILM

TECHNICAL FIELD

The present invention relates to a method for electrically connecting connection terminals of a circuit board with connection portions of electronic devices, as well as to an anisotropic conductive adhesive film used in such a method.

BACKGROUND ART

Traditionally, connection terminals of circuit boards are connected to connection portions of other circuit boards or electronic devices, such as IC chips, via an anisotropic conductive adhesive film 43. As shown in FIG. 4(a), the anisotropic conductive adhesive film 43 is composed of a thermosetting resin 42 and conductive particles 41 dispersed in the thermosetting resin 42.

To improve the connection reliability of such anisotropic conductive adhesive film, the conductive particles have been required to be effectively confined between the connection terminals of a circuit board and the connection portions of an electronic device in making anisotropic conductive connection. To this requirement, a thin film shown in FIG. 4(b) is proposed which contains a greater number of the conductive particles than the film of FIG. 4(a), or a conductive particle-free, thermosetting adhesive layer 44 is laminated to a thin film shown in FIG. 4(c), which contains the same number of the conductive particles as the film of FIG. 4(a) but at a higher density, to make an anisotropic conductive adhesive film 43.

However, the constructions shown in FIG. 4 cannot effectively confine the conductive particles, and, thus, an attempt has been made to prevent the conductive particles from migrating from the connection area to the non-connection area during the thermocompression bonding for anisotropic connection. Specifically, this is done by making use of a technique described in Patent Document 1 for adjusting the melt viscosity of intercalated insulative adhesive-coated film. Using this technique, the resin composition of an entire anisotropic conductive adhesive film is adjusted to increase the melt viscosity of the film.

Patent Document 1: Japanese Patent Application Laid-Open No. 2000-104033

DISCLOSURE OF THE INVENTION

Problems to be Solved by the Invention

However, increasing the melt viscosity of the entire anisotropic conductive adhesive film makes the entire film less fluid during anisotropic conductive connection. As a result, higher pressure must be applied upon compression bonding. This may cause damage in the circuit boards and electronic devices. In addition, the adhesion of the film may become insufficient to temporarily bond the circuit boards to the electronic devices before thermocompression bonding, causing peeling and displacement of the bonded elements.

Accordingly, it is an object of the present invention to ensure fluidity of the anisotropic conductive adhesive film during anisotropic conductive connection of the connection terminals of circuit boards to the connection portions of electronic devices, in such a manner that the conductive particles are effectively confined, that the pressure required for compression bonding is not increased, and that the temporary bonding of the circuit boards to the electronic devices is effected at sufficient strength.

Means for Solving the Problems

The present inventors have discovered that by using a photocurable insulative resin as the insulative adhesive used in an anisotropic conductive adhesive film, and irradiating light onto an area of the anisotropic conductive adhesive film, the area being on or above the connection terminal of a circuit board or the periphery of the connection terminal, the circuit board and the electronic device can be temporary bonded together at sufficient strength, the fluidity of the entire film can be ensured during anisotropic conductive connection, and the melt viscosity of the anisotropic conductive adhesive film can be increased in the area on or above the connection terminal or in the area on or above the periphery of the connection terminal, so that the conductive particles can be effectively confined in the anisotropic connection area without causing an increase in the pressure required for compression bonding. It is this discovery that led to the present invention.

Thus, the present invention in a first aspect provides a method for anisotropically and conductively connecting a connection terminal of a circuit board to a connection portion of an electronic device, the method containing the following steps (a) through (d):

Step (a) of disposing on the circuit board an anisotropic conductive adhesive film composed of a photocurable insulative adhesive and conductive particles dispersed in the adhesive;

Step (b) of disposing on the anisotropic conductive adhesive film an exposure mask having an exposure pattern corresponding to the connection terminal of the circuit board;

Step (c) of irradiating light onto the anisotropic conductive adhesive film via the exposure mask to cause an exposed area of the anisotropic conductive adhesive film to undergo photopolymerization, thereby increasing the melt viscosity in the exposed area; and Step (d) of removing the exposure mask, then placing the connection portion of the electronic device on the anisotropic conductive adhesive film in alignment with the connection terminal of the circuit board, and then, with the two components closely held together, irradiating light onto the entire anisotropic conductive adhesive film to cause the entire film to undergo photopolymerization, thereby connecting the connection terminal of the circuit board to the connection portion of the electronic device.

The present invention in a second aspect provides a method for anisotropically and conductively connecting a connection terminal of a circuit board to a connection portion of an electronic device, the method containing the following steps of (a') through (d'):

(Step (a')) of disposing a multilayered anisotropic conductive adhesive film on the circuit board, the multilayered anisotropic conductive adhesive film having an anisotropic conductive adhesive layer comprising a photocurable insulative adhesive with conductive particles dispersed therein and a thermosetting adhesive layer disposed on at least one surface of the anisotropic conductive adhesive layer;

Step (b') of disposing on the multilayered anisotropic conductive adhesive film an exposure mask having an exposure pattern corresponding to the connection terminal of the circuit board;

Step (c') of irradiating light onto the multilayered anisotropic conductive adhesive film via the exposure mask to cause an exposed area of the photocurable anisotropic conductive adhesive layer of the multilayered anisotropic conductive adhesive film to undergo photopolymerization, thereby increasing the melt viscosity in the exposed area; and Step (d') of removing the exposure mask, then placing the connection portion of the electronic device on the multilayered anisotropic conductive adhesive film in alignment with the connection terminal of the circuit board, and then, with the two components closely held together, curing at least the thermosetting adhesive layer, thereby connecting the connection terminal of the circuit board to the connection portion of the electronic device.

Furthermore, the present invention in a third aspect provides an anisotropic conductive adhesive film having an anisotropic conductive adhesive layer formed of a photocurable insulative adhesive with conductive particles dispersed therein, wherein the anisotropic conductive adhesive layer of the anisotropic conductive adhesive film includes areas having different melt viscosities in accordance with an anisotropic conductive connection pattern.

Advantage of the Invention

The present invention ensures fluidity of the entire anisotropic conductive adhesive or the entire anisotropic conductive adhesive film upon electrical connection of the connection terminals of circuit boards to the connection portions of electronic devices via the anisotropic conductive adhesive or the anisotropic conductive adhesive film, in such a manner that the conductive particles are effectively confined, that the pressure required for compression bonding is not increased, and that the bonding of the circuit boards to the electronic devices is effected at sufficient strength.

BRIEF DESCRIPTION OF THE DRAWINGS

FIG. 4 is a cross-sectional view of a conventional anisotropic conductive adhesive film.

Figure 1:
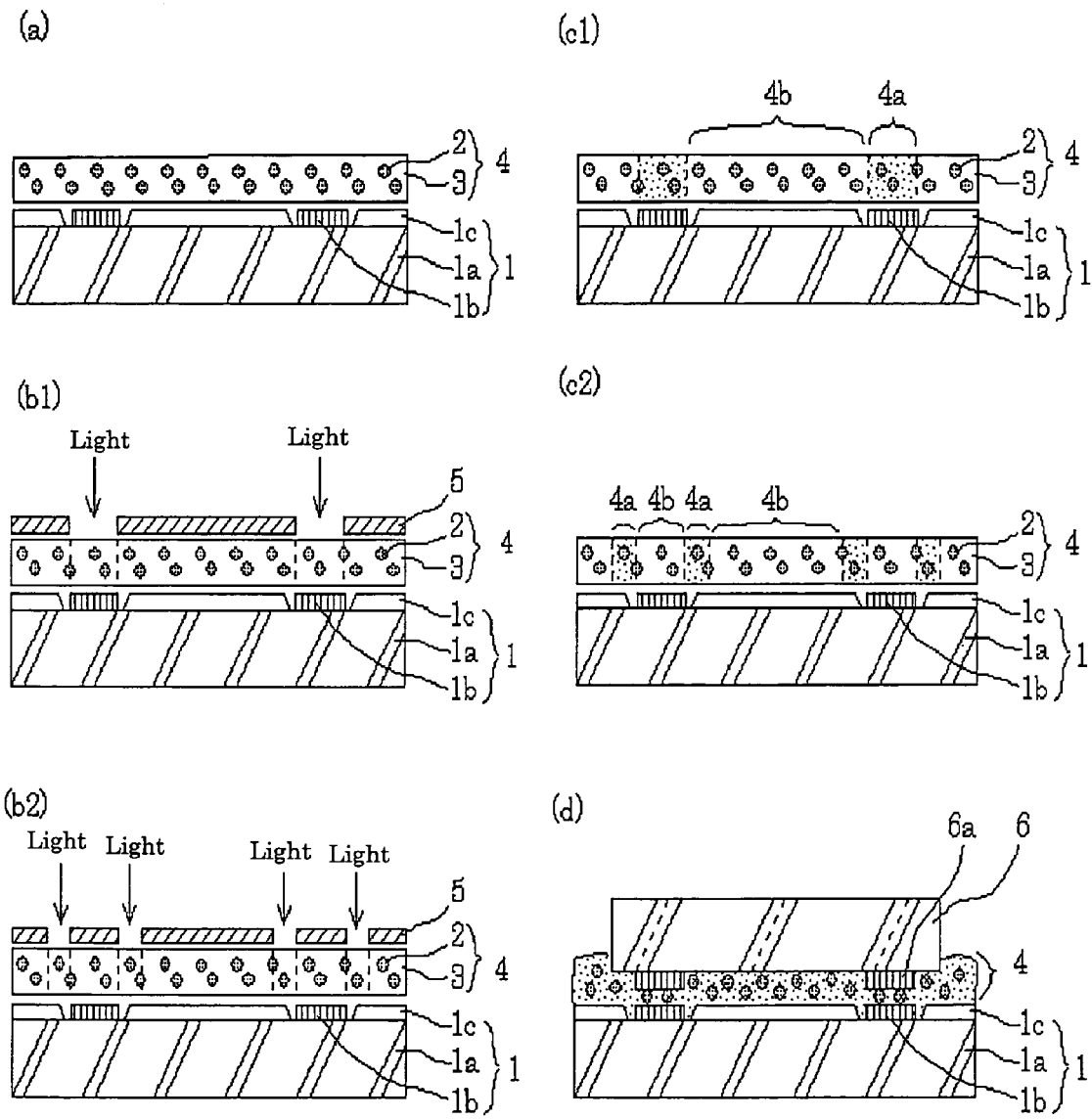
FIG. 1 is a diagram illustrating a method for anisotropic conductive connection of the present invention.

| DESCRIPTION OF REFERENCE NUMERALS | |
|---|---|
| 1, 21 | Circuit board |
| 1b, 21b | Connection terminal |
| 2, 22 | Conductive particle |
| 3, 33 | Photocurable insulative adhesive |
| 4, 26 | Anisotropic conductive adhesive film |
| 24 | Photocurable anisotropic conductive adhesive layer |
| 4a, 24a | Exposed area |
| 4b, 24b | Unexposed area |

BEST MODE FOR CARRYING OUT THE INVENTION

As a first aspect of the present invention, a method for anisotropically and conductively connecting the connection terminal of a circuit board to the connection portion of an electronic device is first described stepwise with reference to FIG. 1.

Step (a)

As shown in FIG. 1(a), an anisotropic conductive adhesive film 4 is disposed on a circuit board 1. The anisotropic conductive adhesive film 4 is composed of a photocurable insulative adhesive 3 and conductive particles 2 dispersed in the photocurable insulative adhesive 3.

The circuit board 1 may be any known circuit board, including flexible printed circuit boards (See, for example, Japanese Patent Application Laid-Open No. Hei 11-013654), junction circuits for semiconductor devices (See, for example, Japanese Patent Application Laid-Open No. Hei 11-097101), bumped wiring circuit boards (Japanese Patent Application Laid-Open No. 2000-303745), ceramic wiring circuit boards, multilayered wiring circuit boards using prepregs. However, it generally is a wiring board consisting of an insulative board 1a, such as polyimide film and aluminum plate, with a circuit pattern of metal foil, such as copper foil, formed on it (not shown). A connection terminal 1b is formed at the end portion of the wiring circuit to connect to other electronic devices (for example, flexible wiring boards, IC chips, antenna elements, capacitor elements, and resistance elements). A known insulative cover coat layer 1c may be deposited between the terminals.

The conductive particles for forming the photocurable anisotropic conductive adhesive film 4 may be any known conductive particles used in anisotropic conductive adhesive films. Examples thereof include particles of metals and metal alloys, such as nickel, iron, copper, aluminum, tin, lead, chromium, cobalt, silver, and gold, metal-coated particles of metal oxides, carbon, graphite, glass, ceramics, and plastics, which may further be coated with an insulating thin film. The size and material of the conductive particles may be properly selected depending on the pitch and pattern of the wiring of the circuit boards to be connected and the thickness and material of the connection terminals.

The photocurable insulative adhesive 3 for forming the photocurable anisotropic conductive adhesive film 4 may be any known photocurable adhesive that can undergo radical or cationic polymerization. Light to irradiate the adhesive film may be ultraviolet rays, electron beam, X rays, or other active energy rays. The adhesive component of the photocurable adhesive may be a photopolymerizable acrylic compound, preferably, an acrylic monomer or oligomer with a molecular weight (weight average molecular weight) of 10000 or less. Preferred examples of the adhesive component include alkyl (meth)acrylates, arylalkyl (meth)acrylates, urethane-modified acrylates, and epoxy-modified acrylates. These components may be used either individually or in combination of two or more.

A known photopolymerization initiator commonly used in photocurable acrylic adhesives may be added to the photocurable insulative adhesive 3. Examples thereof include benzophenone-based photopolymerization initiators, acetophenone-based photopolymerization initiators, benzoin or benzoinalkylether-based photopolymerization initiators, benzyl, benzyldimethylketal, or acylphosphineoxide-based photopolymerization initiators, and thioxanthone-based photopolymerization initiators. These photopolymerization initiators may be used either individually or in combination of two or more. An aliphatic amine or aromatic amine may be added as a photopolymerization assistant.

The amount of the photopolymerization initiator may vary depending on the type of the photocurable adhesive component used: when used with a polymerizable acrylic compound, the photopolymerization initiator is preferably used in an amount of 0.1 to 10 parts by weight with respect to 100 parts by weight of the polymerizable acrylic compound.

In addition to the above-described components, the photocurable insulative adhesive 3 may further contain a thermoplastic resin, such as a phenoxy resin and an epoxy resin, a crosslinking agent, various rubber components, filler, a leveling agent, a viscosity modifier, an antioxidant, and other agents.

The photocurable anisotropic conductive adhesive film 4 can be prepared, for example, by uniformly mixing together the components of the photocurable insulative adhesive 3, the conductive particles, the photopolymerization initiator, and other additives and if necessary, a solvent such as toluene, applying the mixture to a release sheet such as polyethylene terephthalate (PET) sheet, and drying the coating to form a film.

Step (b)

Next, an exposure mask 5 is disposed on the anisotropic conductive adhesive film 4, as shown in FIG. 1(*b*1) or (*b*2). The exposure mask 5 contains an exposure pattern corresponding to the connection terminal 1*b* of the circuit board 1. The exposure pattern of the exposure mask 5 is formed such that areas of the anisotropic conductive adhesive film 4 on or above to the connection terminal 1*b* of the circuit board 1 are exposed to light (FIG. 1(*b*1)) or such that areas of the anisotropic conductive adhesive film 4 above the periphery of the connection terminal 1*b* of the circuit board 1 are exposed to light (FIG. 1(*b*2)). As used herein, the term "periphery" of the connection terminal 1*b* refers not only to circular or square areas surrounding the connection terminal 1*b*, but also to areas of other shapes such as linear-shaped areas or L-shaped areas.

The exposure mask 5 may be a known exposure mask that contains an exposure pattern corresponding to the connection terminal 1*b* of the circuit board 1.

Step (c)

Next, light is irradiated onto the anisotropic conductive adhesive film 4 via the exposure mask 5. This causes the anisotropic conductive adhesive film 4 to undergo photopolymerization in the exposed areas. As a result, the melt viscosity increases in the exposed areas. In the exposure pattern shown in FIG. 1(*b*1), the melt viscosity is increased in the exposed area 4*a* of the anisotropic conductive adhesive film on or above to the connection terminal 1*b* of the circuit board 1, as shown in FIG. 1(*c*1). As a result, the conductive particles are effectively confined in the exposed area 4*a*. Furthermore, the unexposed area of the anisotropic conductive adhesive film 4, in which photopolymerization does not take place, enables the temporary bonding of the circuit board 1 and the electronic device at sufficient strength. This construction also ensures the fluidity of the entire anisotropic conductive adhesive film 4 during anisotropic conductive connection, so that it is not necessary to apply high pressure upon compression bonding.

In the exposure pattern shown in FIG. 1(*b*2), the melt viscosity increases in the exposed area 4*a* of the anisotropic conductive adhesive film above the periphery of the connection terminal 1*b* of the circuit board 1, as shown in FIG. 1(*c*2). Thus, the melt viscosity is not high in the unexposed area 4*b* of the anisotropic conductive adhesive film on or above the connection terminal, so that the conductive particles 2 tend to escape from the area on or above the connection terminal 1*b*. This tendency, however, is counteracted by the presence of the surrounding area with high melt viscosity of the unexposed area 4*b* and, overall, the conductive particles are well confined in the unexposed area 4*b*. Furthermore, the unexposed area of the anisotropic conductive adhesive film 4, in which photopolymerization does not take place, enables the temporary bonding of the circuit board 1 and the electronic device at sufficient strength. This construction also ensures the fluidity of the entire anisotropic conductive adhesive film 4, and the pressure required for compression bonding is further decreased as compared to the construction of FIG. 1(*c*1). For these reasons, this method is suitable when the components are bonded together by a relatively large area using bump bonding technique.

Step (d)

Next, the exposure mask 5 is removed, and the connection portion 6*a* of the electronic device 6 is placed on the anisotropic conductive adhesive film 4 in alignment with the connection terminal 1*b* of the circuit board 1. Then, with the two components closely held together, light is irradiated onto the entire anisotropic conductive adhesive film to cause the entire film to undergo photopolymerization. In this manner, the connection terminal 1*b* of the circuit board 1 can be anisotropically and conductively connected to the connection portion of the electronic device with high connection reliability (FIG. 1(*d*)). The electronic device 6 may be a circuit board similar to the circuit board 1, flexible wiring board, IC chip, antenna element, capacitor element, or resistance element. The connection portion 6*a* may be a known bump or electrode pad structure.

Figure 2:
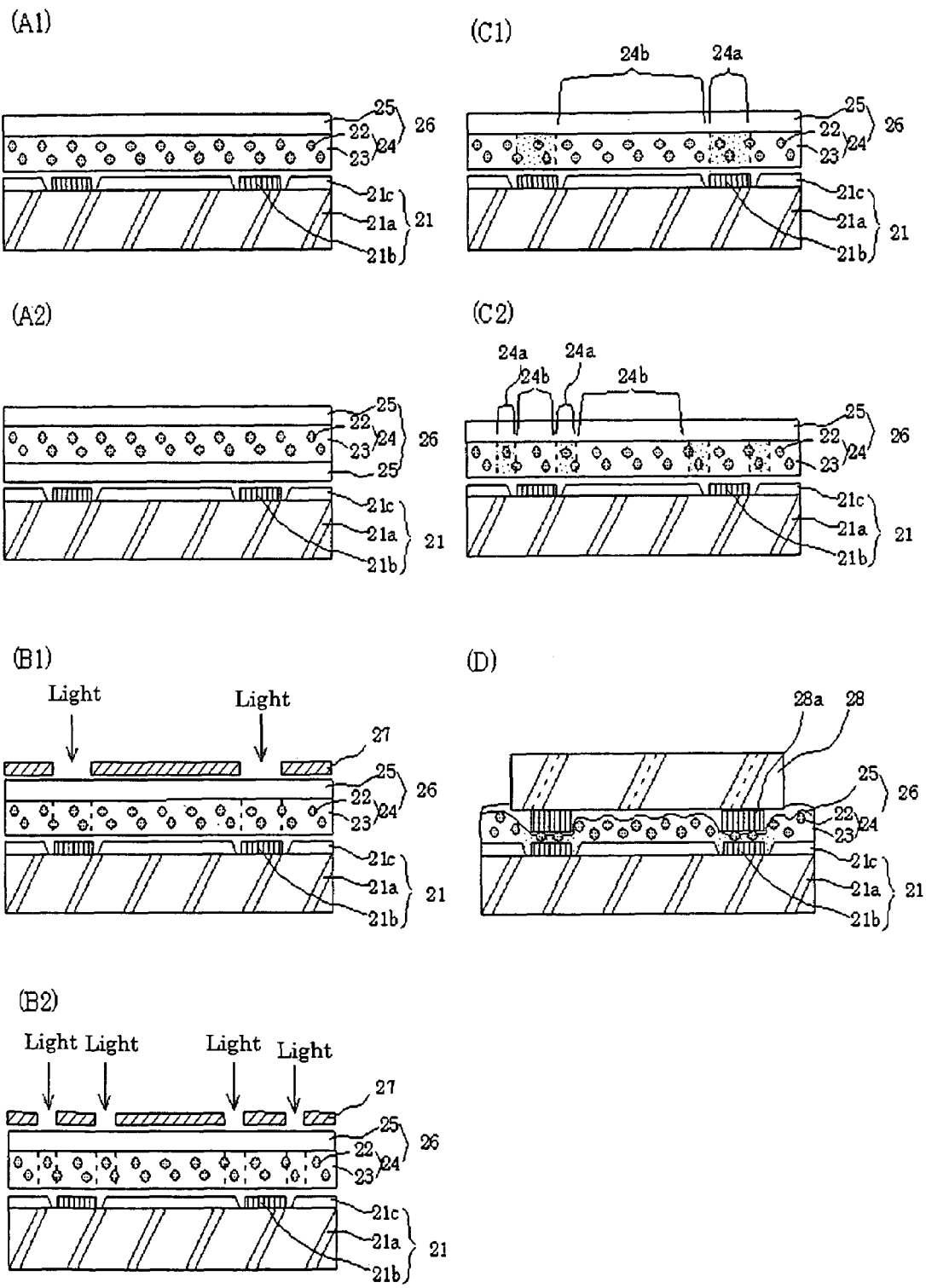
FIG. 2 is a diagram illustrating another method for anisotropic conductive connection of the present invention.

As a second aspect of the present invention, another anisotropic conductive connection method is now described stepwise with reference to FIG. 2. The anisotropic conductive connection of the second aspect differs from the anisotropic conductive connection of the first aspect in that the second aspect uses a multilayered anisotropic conductive adhesive film that has a thermosetting adhesive layer deposited on at least one surface thereof. As described with reference to FIG. 4(*c*), the use of the multilayered anisotropic conductive adhesive film makes it possible to decrease the thickness of the layer containing the conductive particles and to thus increase the density of the conductive particles. As a result, high connection reliability can be achieved without increasing the amount of the conductive particles and, thus, the cost for anisotropic connection can be reduced.

Step (a')

As shown in FIG. 2(A1) or FIG. 2(A2), a multilayered anisotropic conductive adhesive film 26 is first disposed on a circuit board 21. The multilayered anisotropic conductive adhesive film 26 includes a photocurable anisotropic conductive adhesive layer 24 and a thermosetting adhesive layer 25 disposed on at least one surface of the photocurable anisotropic conductive adhesive layer 24. The photocurable anisotropic conductive adhesive layer 24 is composed of a photocurable insulative adhesive 23 and conductive particles 22 dispersed in the photocurable anisotropic conductive adhesive layer 23. Although in FIG. 2(A1), the multilayered anisotropic conductive adhesive film 26 having the thermosetting adhesive layer 25 on one surface thereof is disposed on the circuit board 21 with the anisotropic conductive adhesive layer 24 facing the circuit board 21, the multilayered anisotropic conductive adhesive film 26 may be arranged with the thermosetting adhesive layer 25 facing the circuit board 21. Alternatively, a multilayered anisotropic conductive adhesive film 26 with the thermosetting adhesive layer 25 disposed on each surface may be used as shown in FIG. 2(A2).

The thermosetting resin for forming the thermosetting adhesive layer 25 may be an epoxy resin, urethane resin, or unsaturated polyester resin. Of these, an epoxy resin that forms a solid at room temperature is preferred. This type of epoxy resin may be used in conjunction with an epoxy resin that forms a liquid at room temperature. The proportions of the epoxy resin forming a solid at room temperature and the epoxy resin forming a liquid at room temperature are properly determined depending on the requirements for the anisotropic conductive adhesive film. For the purposes of increasing the flexibility of the film made of these epoxy resins forming a solid or a liquid at room temperature and thereby increasing the peel strength of the anisotropic conductive adhesive film, a flexible epoxy resin is preferably used in conjunction with these epoxy resins. The amount of the flexible epoxy resin in the thermosetting insulative adhesive is preferably in the range of 5 to 35 wt %, and more preferably in the range of 5 to 25 wt %, since too little of the flexible epoxy resin cannot provide the desired effect and too much of the flexible epoxy resin results in a decreased heat resistance.

The circuit board 21, the conductive particles 22, and the photocurable insulative adhesive 23 may be the same as the circuit board 1, the conductive particles 2, and the photocurable insulative adhesive 3 described with reference to FIG. 1, respectively.

For example, the multilayered anisotropic conductive adhesive film 26 can be prepared as follows: The components of the photocurable insulative adhesive 3, the conductive particles, the photopolymerization initiator and other additives and, if necessary, a solvent such as toluene are uniformly mixed together. The mixture is then applied to a release sheet such as PET sheet and the coating is dried to form a photocurable anisotropic conductive adhesive film. Meanwhile, the thermosetting resin is formed into a film by casting or die extrusion. Using a known lamination technique, the two films are laminated together.

Step (b')

Next, an exposure mask 27 is disposed on the multilayered anisotropic conductive adhesive film 26 shown in FIG. 2(a1). The exposure mask 27 contains an exposure pattern corresponding to the connection terminal 21b of the circuit board 21. This step is the same as the step (b) of the aspect shown by FIG. 1. FIG. 2(b1) shows an exposure pattern of the exposure mask 27 formed such that areas of the multilayered anisotropic conductive adhesive film 26 on or above the connection terminal 21b of the circuit board 21 are exposed to light. FIG. 2(B2) shows another exposure pattern of the exposure mask 5 formed such that areas of the multilayered anisotropic conductive adhesive film 26 above the periphery of the connection terminal 21b of the circuit board 21 are exposed to light.

The exposure mask 27 is also provided in the construction shown in FIG. 2(A2) in a similar manner to the construction shown in FIG. 2(A1) (not shown).

Step (c')

Next, light is irradiated onto the multilayered anisotropic conductive adhesive film 26 via the exposure mask 27. This causes the anisotropic conductive adhesive layer 24 of the multilayered anisotropic conductive adhesive film 26 to undergo photopolymerization in exposed areas 24a. As a result, the melt viscosity increases in the exposed areas 24a. In the exposure pattern shown in FIG. 2(B1), the melt viscosity is increased in the exposed area 24a of the anisotropic conductive adhesive layer 24 of the anisotropic conductive adhesive film 26 on or above the connection terminal 21b of the circuit board 21, as shown in FIG. 2(C1). As a result, the conductive particles are effectively confined in the exposed area 24a. Furthermore, the unexposed area 24b of the anisotropic conductive adhesive layer 24 of the anisotropic conductive adhesive film 26, in which photopolymerization does not take place, enables the temporary bonding of the circuit board 21 and the electronic device at sufficient strength. This construction also ensures the fluidity of the entire anisotropic conductive adhesive film 26, so that it is not necessary to apply high pressure upon compression bonding of the film.

In the exposure pattern shown in FIG. 2(B2), the melt viscosity increases in the exposed area 24a of the anisotropic conductive adhesive layer 24 of the anisotropic conductive adhesive film 26 above the periphery of the connection terminal 21b of the circuit board 21, as shown in FIG. 2(c2). Thus, the melt viscosity is not high in the unexposed area 24b of the anisotropic conductive adhesive layer 24 of the anisotropic conductive adhesive film 26 on or above the connection terminal 21b, so that upon compression bonding, the conductive particles 22 tend to escape from the area on or above the connection terminal 21b due to the melt viscosity. This tendency, however, is counteracted by the presence of the surrounding area (dam) with high melt viscosity of the unexposed area and, overall, the conductive particles 22 are well confined in the unexposed area 24b. Furthermore, the unexposed area 24b of the anisotropic conductive adhesive layer 24 of the anisotropic conductive adhesive film 26, in which photopolymerization does not take place, enables the temporary bonding of the circuit board 21 and the electronic device at sufficient strength. This construction also ensures the fluidity of the entire anisotropic conductive adhesive film 26 during anisotropic conductive connection, and the pressure required for compression bonding is further decreased as compared to the construction of FIG. 1(c1). For these reasons, this method is suitable when the components are bonded together by a relatively large area using bump bonding technique.

Step (d')

Next, the exposure mask 27 is removed, and the connection portion 28a of the electronic device 28 is placed on the multilayered anisotropic conductive adhesive film 26 in alignment with the connection terminal 21b of the circuit board 21. Then, with the two components closely held together, at least the thermosetting adhesive layer 25 is cured by application of heat to connect the connection terminal 21b of the circuit board 21 to the connection portion 28a of the electronic device 28. Alternatively, light may be irradiated to cure the photocurable anisotropic adhesive layer 24. In this manner, the connection terminal 21b of the circuit board 21 can be anisotropically and conductively connected to the connection portion 28a of the electronic device 28 with high connection reliability (FIG. 2(D)). The electronic device 28 may be the same as the electronic device 6 described with reference to FIG. 1(d).

Figure 3:
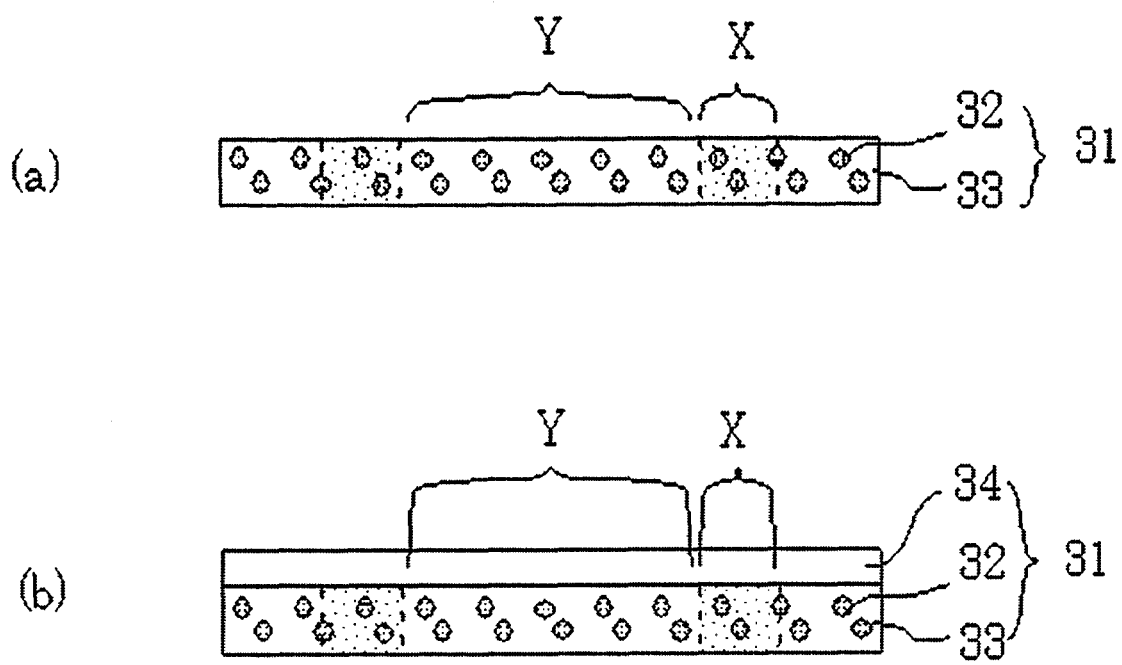
FIG. 3 is a cross-sectional view of an anisotropic conductive adhesive film of the present invention.

Referring now to FIG. 3(a), an anisotropic conductive adhesive film 31 for use in the method for anisotropic conductive connection provided according to the first and second aspects of the present invention comprises an anisotropic conductive adhesive layer formed of a photocurable insulative adhesive 33 and conductive particles 32 dispersed in the photocurable insulative adhesive 33. According to the pattern of anisotropic conductive connection, the anisotropic conductive adhesive film 31 includes regions with different melt viscosities: the region X with relatively high melt viscosity and the region Y with relatively low melt viscosity.

When the anisotropic conductive connection is established via the region X, the region X corresponds to the exposed area as described with reference to FIG. 1(b1) and FIG. 2(B1), which is irradiated with light to cause photopolymerization and thus increase the melt viscosity in the region. Thus, the conductive particles are effectively confined in the region X, as described with reference to FIG. 1(c1) and FIG. 2(C1). In addition, the temporary bonding of the circuit board and the electronic device is effected at sufficient strength. This construction also ensures the fluidity of the entire anisotropic conductive adhesive film during anisotropic conductive connection, so that it is not necessary to apply high pressure upon compression bonding of the film.

When the anisotropic conductive connection is established via the region Y, the region Y is an area surrounded by the region X above the periphery of the anisotropic conductive connection region with high melt viscosity, as described with reference to FIG. 1(b2) and FIG. 2(B2). Thus, the conductive particles are effectively confined in the region Y, as described with reference to FIG. 1(c1) and FIG. 2(C1). This construction enables the temporary bonding of the circuit board and the electronic device at sufficient strength and also ensures the fluidity of the entire anisotropic conductive adhesive film during anisotropic conductive connection. Furthermore, the pressure required for compression bonding is further decreased as compared to the construction of FIG. 1(c1). For these reasons, this construction is suitable when the components are bonded together by a relatively large area using bump bonding technique.

The anisotropic conductive adhesive film 31 may have the thermosetting adhesive layer 34 disposed on one surface (FIG. 3(b)) or both surfaces thereof.

The conductive particles 32, the photocurable insulative adhesive 33 and the thermosetting adhesive layer 34 may be the same as the above-described conductive particles 2, the photocurable insulative adhesive 3, and the thermosetting adhesive layer 25, respectively.

EXAMPLES

Examples 1 through 3 and Comparative Examples 1 and 2

The components shown in Table 1 were uniformly mixed in a mixed solvent of toluene and ethyl acetate (1:1 by weight) such that the solution contains a 60 wt % solid content. This gave a UV-curable adhesive composition. The composition was applied to a release agent-treated polyethylene terephthalate film to a dry thickness of 20 μm or 40 μm, and the coated film was dried at 80° C. for 5 min to make a photocurable anisotropic conductive adhesive film. Using a rheometer RS150 (Haake), the melt viscosity of this film was determined to be $6.0 \times 10^6$ mPa·S (80° C.) before UV irradiation and $3.0 \times 10^8$ mPa·S (80° C.) after UV irradiation (200 mJ/cm² (320-390 nm)).

Also, the components shown in Table 2 were uniformly mixed in a mixed solvent of toluene and ethyl acetate (1:1 by weight) such that the solution contains a 60 wt % solid content. This gave a thermosetting adhesive composition. The composition was applied to a release agent-treated polyethylene terephthalate film to a dry thickness of 10 μm, 20 μm or 40 μm, and the coated film was dried at 80° C. for 5 min to make a thermosetting adhesive film. Using a rheometer RS150 (Haake), the melt viscosity of the film was determined to be $6.0 \times 10^6$ mPa·S (80° C.).

The 40 μm-thick single-layered photocurable anisotropic conductive adhesive film was designated as a photocurable anisotropic conductive adhesive film of Example 1. The 20 μm-thick photocurable anisotropic conductive adhesive film having the 20 μm-thick thermosetting adhesive film laminated on one surface thereof was designated as a multilayered anisotropic conductive adhesive film of Examples 2 and 3. The 20 μm-thick photocurable anisotropic conductive adhesive film having the 10 μm-thick thermosetting adhesive film laminated on both surfaces thereof was designated as a multilayered anisotropic conductive adhesive film of Example 3.

In addition, the components shown in Table 3 were uniformly mixed in a mixed solvent of toluene and ethyl acetate (1:1 by weight) such that the solution contains a 60 wt % solid content. This gave a thermosetting adhesive composition. The composition was applied to a release agent-treated polyethylene terephthalate film to a dry thickness of 40 μm, and the coated film was dried at 80° C. for 5 min to make a thermosetting adhesive film. This film was designated as a thermosetting anisotropic conductive adhesive film of Comparative Example 1. Using a rheometer RS150 (Haake), the melt viscosity of the film was determined to be $6.0 \times 10^6$ mPa·S (80° C.).

Furthermore, the components shown in Table 4 were uniformly mixed in a mixed solvent of toluene and ethyl acetate (1:1 by weight) such that the solution contains a 60 wt % solid content. This gave a thermosetting adhesive composition. The composition was applied to a release agent-treated polyethylene terephthalate film to a dry thickness of 40 μm, and the coated film was dried at 80° C. for 5 min to make a thermosetting adhesive film. This film was designated as a thermosetting anisotropic conductive adhesive film of Comparative Example 2. Using a rheometer RS150 (Haake), the melt viscosity of the film was determined to be $9.0 \times 10^7$ mPa·S (80° C.).

TABLE 1

| Component | Weight parts |
|---|---|
| Phenoxy resin (YP50, Toto Kagaku) | 10 |
| Epoxy resin (HP7200H, Dai Nippon Ink and Chemicals) | 10 |
| Epoxy group-containing epoxyacrylate oligomer (EB3605, Union Carbide) | 10 |
| Epoxy resin (HX3941HP, Dai Nippon Ink and Chemicals) | 10 |
| Photopolymerization initiator (TPO, BASF) | 1 |
| Conductive particles (Ni/Au plated resin particles (3.2 μm), Nippon Chemical Industrial) | 9 |

TABLE 2

| Component | Weight parts |
|---|---|
| Phenoxy resin (YP50, Toto Kagaku) | 10 |
| Epoxy resin (HP4032D, epoxy equivalents 136-150 g/eq, Dai Nippon Ink and Chemicals) | 20 |
| Epoxy-dispersed imidazole-based curing agent (HX3941HP, Asahi Kasei Epoxy) | 15 |

TABLE 3

| Component | Weight parts |
|---|---|
| Phenoxy resin (YP50, Toto Kagaku) | 10 |
| Epoxy resin (HP4032D, epoxy equivalents 136-150 g/eq, Dai Nippon Ink and Chemicals) | 20 |
| Epoxy-dispersed imidazole-based curing agent (HX3941HP, Asahi Kasei Epoxy) | 15 |
| Conductive particles (Ni/Au plated resin particles (3.2 μm), Nippon Chemical Industrial) | 10 |

TABLE 4

| Component | Weight parts |
|---|---|
| Phenoxy resin (YP50, Toto Kagaku) | 20 |
| Epoxy resin (HP4032D, epoxy equivalents 136-150 g/eq, Dai Nippon Ink and Chemicals) | 10 |
| Epoxy-dispersed imidazole-based curing agent (HX3941HP, Asahi Kasei Epoxy) | 15 |
| Conductive particles (Ni/Au plated resin particles (3.2 μm), Nippon Chemical Industrial) | 10 |

The anisotropic conductive adhesive films of Examples and Comparative Examples so obtained were evaluated for the tackiness in the manner described below. Each of the anisotropic conductive adhesive films of Examples and Comparative Examples was also used to anisotropically and conductively connect a test circuit board to a test transparent liquid crystal board and the number of the confined particles were determined in the manner described below. The results are shown in Table 5.

The anisotropic conductive adhesive film of Example 1 was placed on the test transparent liquid crystal board and light (320 to 390 nm) was irradiated onto the film at 200 mJ/cm$^2$ in the area on or above the connection terminal. Subsequently, while the transparent liquid crystal board and the test circuit board were aligned and held together, the two boards were thermally bonded together at 170° C., 80 Mpa for 10 sec.

The anisotropic conductive adhesive films of Examples 2 and 3 were each placed on the test transparent liquid crystal board and light (320 to 390 nm) was irradiated onto the film at 200 mJ/cm$^2$ in the area on or above the connection terminal. Subsequently, while the test transparent liquid crystal board and the test circuit board were aligned and held together, the two boards were thermally bonded together. The anisotropic conductive adhesive film of Example 2 was placed on the test transparent liquid crystal board such that the back side of the photocurable anisotropic conductive adhesive layer of the anisotropic conductive adhesive film faces the test transparent liquid crystal board.

The thermosetting anisotropic conductive adhesive films of Comparative Examples 1 and 2 were each placed on the test transparent liquid crystal board. Subsequently, while the transparent liquid crystal board and the test circuit board were aligned and held together, the two boards were thermally bonded together at 170° C., 80 Mpa for 10 sec.

Tackiness

Using a hot press, each ACF (anisotropic conductive adhesive film)/release agent-treated PET (polyethylene terephthalate) was thermally bonded to a glass plate at 40° C., 0.5 Mpa for 2 sec. Subsequently, the release agent-treated PET was removed and the exposed ACF was observed.

(Evaluation Criteria)

The tackiness was rated as follows:

"G": ACF was transferred to the glass surface; and

"NG": ACF was not transferred to the glass surface.

Number of Confined Particles

The number of conductive particles present on the bumps of the compression bonded IC (surface area of each bump=2500 μm$^2$) was counted using a microscope and the average was determined.

TABLE 5

| Properties Evaluated | Example | | | Comparative Example | |
|---|---|---|---|---|---|
| | 1 | 2 | 3 | 1 | 2 |
| Tackiness | G | G | G | G | NG |
| Number of confined conductive particles (particles/2500 μm$^2$) | 25 | 24 | 22 | 16 | 19 |

As can be seen from Table 5, the anisotropic conductive adhesive film of Example 1 comprising a single layer of UV-curable anisotropic conductive adhesive had an increased melt viscosity of the adhesive in the area on or above the connection terminal and thus showed a high tackiness. The conductive particles were effectively confined in this example. As in Example 1, the anisotropic conductive adhesive film of Example 2 had an increased melt viscosity of the adhesive in the area on or above the connection terminal. Unlike the anisotropic conductive adhesive film of Example 1, however, the anisotropic conductive adhesive film of Example 2 included the thermosetting adhesive layer on one surface, and the UV-curable anisotropic conductive adhesive layer was half as thick. It turned out that the anisotropic conductive adhesive film of Example 2 had a high tackiness and, despite the UV-curable anisotropic conductive adhesive layer that was half as thick, the decrease in the number of the confined conductive particles was kept at a practically acceptable level of 4%. As in Example 1, the anisotropic conductive adhesive film of Example 3 had an increased melt viscosity of the adhesive in the area on or above the connection terminal. Unlike the anisotropic conductive adhesive film of Example 1, however, the anisotropic conductive adhesive film of Example 3 included the thermosetting adhesive layer on both surfaces, and the UV-curable anisotropic conductive adhesive layer was half as thick. It turned out that the anisotropic conductive adhesive film of Example 3 had a high tackiness and, despite the UV-curable anisotropic conductive adhesive layer that was half as thick, the decrease in the number of the confined conductive particles was kept at a practically acceptable level of 12%.

In comparison, the conductive particles were not effectively confined in the anisotropic conductive adhesive films of Comparative Examples 1 and 2, which each included the single layer of the thermosetting anisotropic conductive adhesive. The tackiness was insufficient in Comparative Example 2.

INDUSTRIAL APPLICABILITY

According to the method of the present invention intended for electrically connecting the connection terminals of circuit boards to the connection portions of electronic devices by the use of an anisotropic conductive adhesive or anisotropic conductive adhesive film, the fluidity of the entire anisotropic conductive adhesive or the entire anisotropic conductive adhesive film during the connection method is ensured, in such a manner that the conductive particles are effectively confined, that the pressure required for compression bonding is not increased, and that the bonding of the circuit boards to the electronic devices is effected at sufficient strength. Therefore, the method of the present invention is suitable for connecting a variety of circuit boards to electronic devices.

The invention claimed is:

1. A method for anisotropically and conductively connecting a connection terminal of a circuit board to a connection portion of an electronic device, the method comprising the following steps (a) through (d):

Step (a) of disposing on the circuit board an anisotropic conductive adhesive film composed of a photocurable insulative adhesive and conductive particles dispersed in the adhesive;

Step (b) of disposing on the anisotropic conductive adhesive film an exposure mask having an exposure pattern corresponding to the connection terminal of the circuit board;

Step (c) of irradiating light onto the anisotropic conductive adhesive film via the exposure mask to cause an exposed area of the anisotropic conductive adhesive film to undergo photopolymerization, thereby increasing the melt viscosity in the exposed area wherein light is irradiated onto an area of the anisotropic conductive adhesive film, the area being on or above the connection terminal of the circuit board; and Step (d) of removing the exposure mask, then placing the connection portion of the electronic device on the anisotropic conductive adhesive film in alignment with the connection terminal of the circuit board, and then, with the two components closely held together, irradiating light onto the entire anisotropic conductive adhesive film to cause the entire film to undergo photopolymerization, thereby connecting the connection terminal of the circuit board to the connection portion of the electronic device.

* * * * *